United States Patent [19]
Lin

[11] Patent Number: 5,409,352
[45] Date of Patent: Apr. 25, 1995

[54] CPU HEAT DISSIPATING DEVICE

[76] Inventor: Mike Lin, No. 56, Lane 55 Dong-Rong Rd., Sei-Rong Village, Da-Lei Hsiang, Tai-Chung Hsien, Taiwan, Prov. of China

[21] Appl. No.: 228,805

[22] Filed: Apr. 18, 1994

[51] Int. Cl.$^6$ ............................................. F04D 29/58
[52] U.S. Cl. ...................... 415/177; 415/208.3; 415/213.1; 165/80.3; 165/126; 257/722; 361/695; 361/697
[58] Field of Search ............... 415/208.3, 211.1, 213.1, 415/214.1, 177; 361/695, 696, 697; 165/80.3, 125, 126; 257/722

[56] References Cited
U.S. PATENT DOCUMENTS

| | | | |
|---|---|---|---|
| 5,288,203 | 2/1994 | Thomas | 415/214.1 |
| 5,297,617 | 3/1994 | Herbert | 361/697 |
| 5,309,983 | 5/1994 | Bailey | 165/80.3 |
| 5,335,722 | 8/1994 | Wu | 361/697 |
| 5,353,863 | 10/1994 | Yu | 361/695 |
| 5,368,094 | 11/1994 | Hung | 361/695 |

Primary Examiner—Edward K. Look
Assistant Examiner—James A. Larson
Attorney, Agent, or Firm—Pro-Techtor International

[57] ABSTRACT

A CPU heat dissipating device, which includes a radiating flange having a plurality of radiating fins spaced on a flat bottom plate thereof around a circle and defining a receiving chamber to hold a fan, and a flat cover plate covered on the radiating flange over the fan and having a ventilation port at the center vertically aligned with the fan and a plurality of radial ribs spaced around the ventilation port at the bottom and respectively fitting the radiating fins.

3 Claims, 5 Drawing Sheets

CPU HEAT DISSIPATING DEVICE

BACKGROUND OF THE INVENTION

The present invention relates to a CPU heat dissipating device for reducing the temperature of the CPU of any of a variety of electronic apparatus, which requires less installation space.

During the operation of the CPU of a computer system or the like, heat will be released. Therefore, a heat dissipating device must be installed to quickly carry away from the CPU. FIG. 1 shows a CPU heat dissipating device according to the prior art, which comprises a radiating flange 10 mounted on the CPU 12 at the top, and a fan 11 fastened to the radiating flange 10 at the top. When operated, currents of air are caused by the fan 11 to quickly carry heat away. This structure of CPU heat dissipating device is functional, however, it needs much installation space. Because the radiating flange 10 is mounted on the CPU 12 at the top and the fan 11 is fastened to the radiating flange 10 at the top, the combined height of the CPU 12, the radiating flange 10 and the fan 11 greatly increases the height of the mainframe of the computer system or the like. Furthermore, because the fan 11 sends currents of air downwards, currents of air can not completely pass through the small exhaust port on the mainframe of the computer system or the like, causing the heat dissipating efficiency of the heat dissipating device to be affected.

SUMMARY OF THE INVENTION

The present invention has been accomplished to provide a CPU heat dissipating device which eliminates the aforesaid problems. According to one aspect of the present invention, the radiating flange has a plurality of radiating fins raised from a flat bottom plate thereof at the top and spaced around a circle, and therefore the fan can be installed in the receiving chamber defined within the radiating fins without increasing the height of the CPU heat dissipating device. According to another aspect of the present invention, the fan is mounted within the radiating fins in a horizontal position so that currents of air caused by the fan flow through the radial gaps among the radiating fins horizontally.

DETAILED DESCRIPTION OF THE PREFERRED EMBODIMENT

Figure 1:
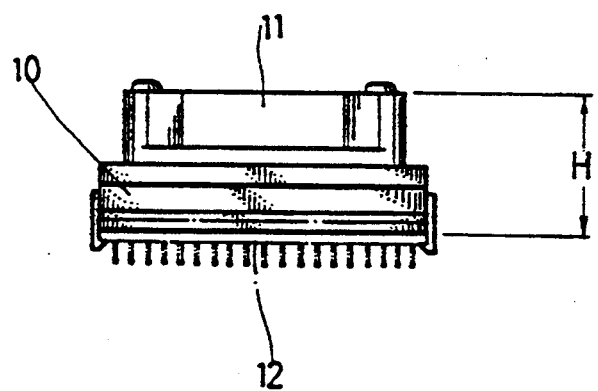
FIG. 1 is a side elevation of a CPU heat dissipating device according to the prior art.
Figure 2:
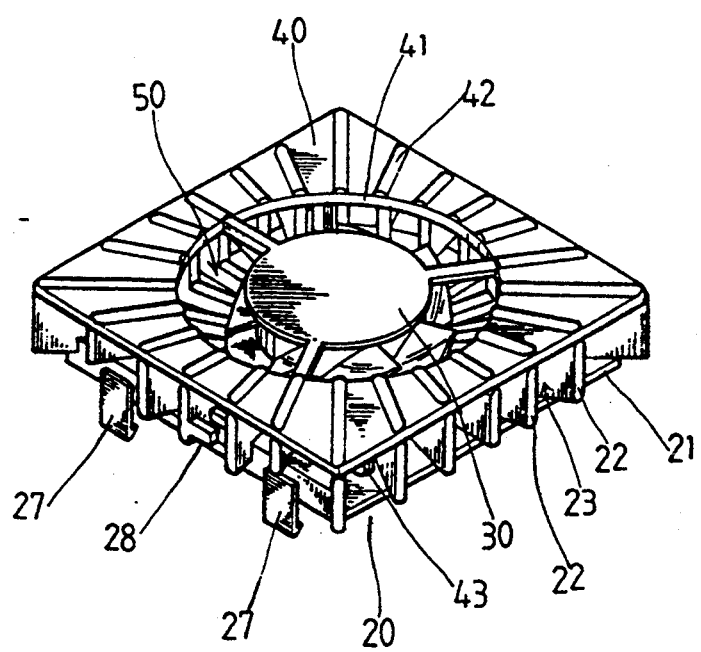
FIG. 2 is an elevational view of a CPU heat dissipating device according to the preferred embodiment of the present invention.

Referring to FIG. 2, a CPU heat dissipating device in accordance with the present invention is generally comprised of a radiating flange 20 and a fan 30 mounted within the radiating flange 20, and a flat cover plate 40 covered on the radiating flange 20 over the fan 30.

Figure 3:
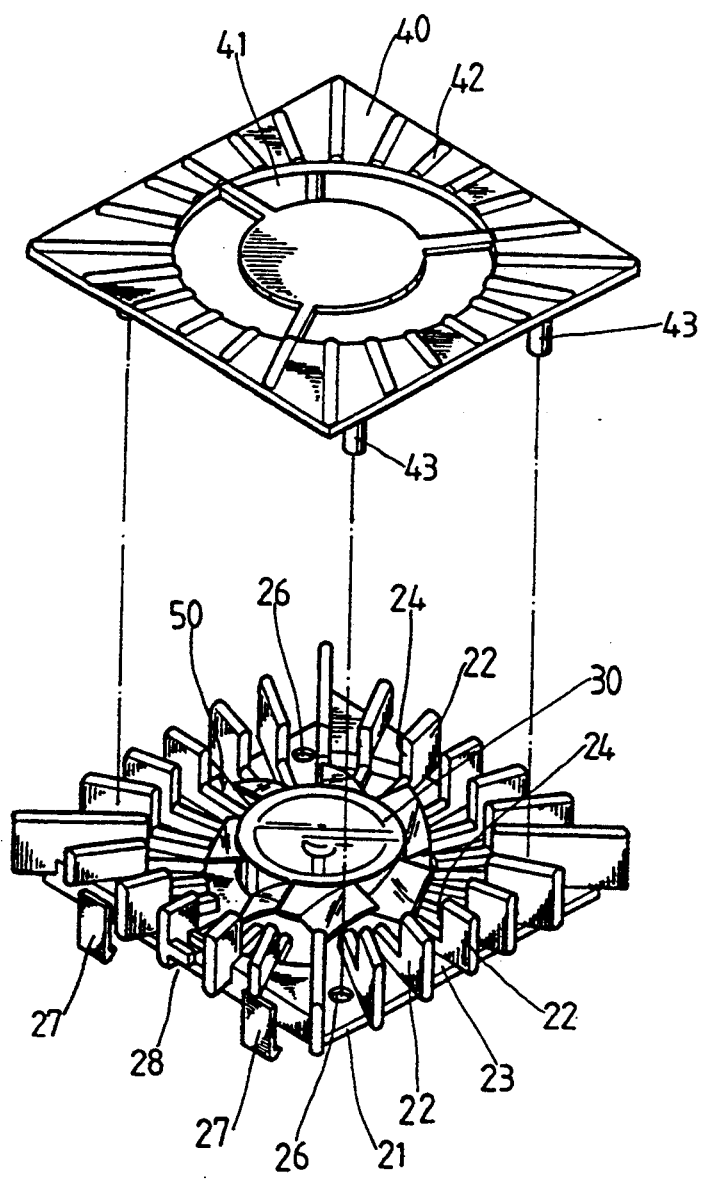
FIG. 3 is a dismantled view of the radiating flange and the cover plate for the CPU heat dissipating device shown in FIG. 2.

Referring to FIG. 3 and FIG. 2 again, the radiating flange 20 comprises a bottom plate 21 and a plurality of radiating fins 22 integrally molded on the bottom plate 21 and radially spaced by gaps 23 around a circle. Therefore, a circular receiving chamber 50 is defined within the radiating fins 22 for mounting the fan 30.

Figure 4:
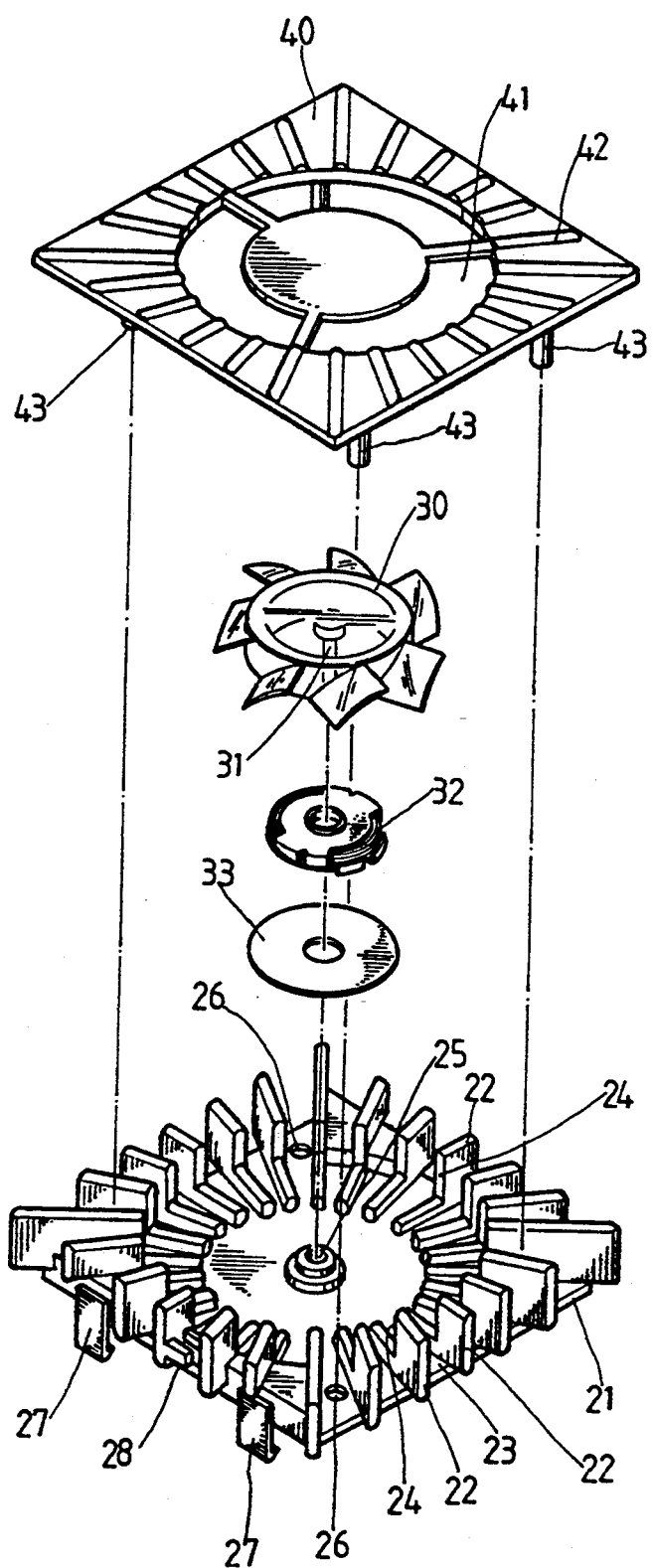
FIG. 4 is an exploded view of CPU heat dissipating device shown in FIG. 2.

Referring to FIG. 4, the bottom plate 21 has a center hole 25 for mounting the fan shaft 31 of the fan 30. The fan 30 further comprises a conductive coil 32 mounted around the fan shaft 31 and supported on a washer 33 above the bottom plate 21.

Figure 5:
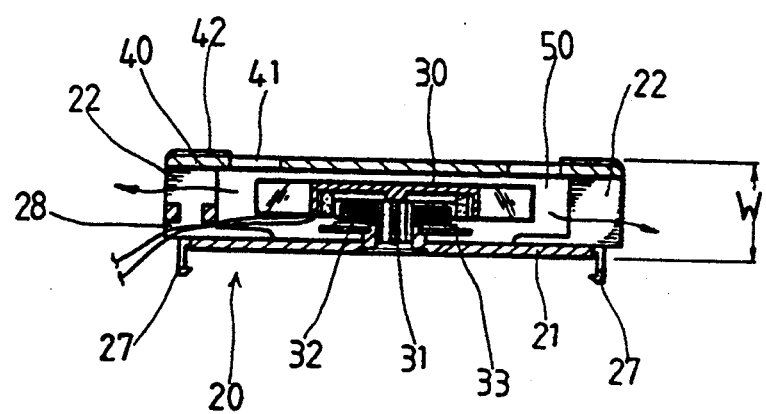
FIG. 5 is sectional view of the CPU heat dissipating device shown in FIG. 2.

Referring to FIG. 5 and FIG. 4 again, the flat cover plate 40 covers over the radiating fins 22, having a ventilation port 41 at the center in size approximately equal to the diameter of the fan 30, a plurality of plug rods 43 vertically disposed at the bottom respectively fitted into respective plug holes 26 on the bottom plate 21, and a plurality of radial ribs 42 spaced around the ventilation port 41 at the top corresponding to the radiating fins 22 on the radiating flange 20.

Referring to FIG. 4 again, the radiating flange 20 further comprises a plurality of bottom hooks 27 for fastening to the CPU of a computer system or the like through hooked joints, and a wire hole 28 for passing the electric lead wires of the fan 30.

Referring to FIG. 5 again, the fan 30 is mounted within the circular receiving chamber 50 surrounded by the radiating fins 22 and covered by the flat cover plate 40, therefore the height W of the heat dissipating device is equal to the combined height of the radiating flange 20 and the flat cover plate 40, and the installation of the fan 30 does not increase the height of the heat dissipating device. When the fan 30 is operated, currents of air are driven out of the radiating flange 20 through the gaps 23 around the border of the radiating flange 20, therefore heat can be efficiently carried away.

What is claimed is:

1. A CPU heat dissipating device comprising a radiating flange having a bottom plate mounted on a CPU of a mainframe of a computer system and a plurality of radiating fins raised from said bottom plate at the top and spaced around a circle and defining a receiving chamber, which receives a fan, and a flat cover plate covered on said radiating flange over said fan and having a ventilation port at the center vertically aligned with said fan and a plurality of radial ribs spaced around said ventilation port at the top and respectively corresponding to said radiating fins.

2. The CPU heat dissipating device of claim 1, wherein said fan comprises a fan shaft mounted in a center hole on said bottom plate and a conductive coil mounted around said fan shaft.

3. The CPU heat dissipating device of claim 1, wherein said bottom plate of said radiating flange comprises a plurality of hooks respectively hooked on the CPU, a wire hole for passing electric lead wires of a conductive coil, and a plurality of plug holes around four corners thereof; said flat cover plate has a plurality of plug rods at the bottom respectively fitted into the plug holes on said bottom plate of said radiating flange.

* * * * *